United States Patent
Dohrmann et al.

(10) Patent No.: US 6,560,570 B1
(45) Date of Patent: May 6, 2003

(54) METHOD AND APPARATUS FOR CONNECTING FINITE ELEMENT MESHES AND PERFORMING SIMULATIONS THEREWITH

(75) Inventors: Clark R. Dohrmann, Albuquerque, NM (US); Samuel W. Key, Albuquerque, NM (US); Martin W. Heinstein, Albuquerque, NM (US)

(73) Assignee: Sandia Corporation, Sebuquerque, NM (US)

( * ) Notice: Subject to any disclaimer, the term of this patent is extended or adjusted under 35 U.S.C. 154(b) by 0 days.

(21) Appl. No.: 09/444,526

(22) Filed: Nov. 22, 1999

(51) Int. Cl.[7] .............................. G06G 7/48; G06G 7/50; G06F 17/50; G06F 17/10; G06F 7/60
(52) U.S. Cl. ...................... 703/7; 703/1; 703/2; 703/6; 703/9
(58) Field of Search ................................ 703/7, 1, 2, 3, 703/9

(56) References Cited

U.S. PATENT DOCUMENTS 6,195,625 B1    2/2001  Day et al. ...................... 703/1

OTHER PUBLICATIONS

"Papers and Reports", http://sherpa.sandia.gov/9231home/papers–body.html Printed Dec. 6, 2002.*
Peery and Budge, "RHALE: A MMALE Shock Physics Code for Arbitrary Meshes". 7th IMACS Int'l Conference on Computer Methods for Partial Differential Equations. Rutgers, NJ, Jun. 22–24, 1992.*
Randall et al. "Recent Progress in ALEGRA Development and Application to Ballistic Impacts". Proceedings of the 1996 Hypervelocity Impact Symposium. Freiburg, Germany, Oct. 7–10, 1996.*
Attaway et al. "PRONTO3D User's Instructions: A Transient Dynamic Code for Nonlinear Structural Analysis" SAND98–1361. Printed: Jun. 1998. Revised: Aug. 1998. (Henceforth referred to as "Attaway et al").
York, Allen and Terry Day. "The DyMesh Method for Three–Dimensional Multi–Vehicle Collision Simulation". Accident Reconstruction: Technology and Animation IX, (SP–1407), Detroit Michigan, Mar. 1–4, 1999.
Sjaardema, Greg. "Sandia Engineering Analysis Code Access System (SEACAS)". http://endo.sandia.gov/SEACAS/Documentation/SEACAS.html. Printed on May 15, 2002.
Sjaardema, Gregory. "GJOIN: A Program for Merging Two or More GENESIS Databases." Printed: Dec. 1992.
Laursen et al. "SEACAS Theory Manuals: Part III. Finite Element Analysis in Nonlinear Solid Mechanics". Printed: Mar. 1999.*

(List continued on next page.)

Primary Examiner—Hugh Jones
Assistant Examiner—Ayal I Sharon
(74) Attorney, Agent, or Firm—V. Gerald Grafe; George H. Libman

(57) ABSTRACT

The present invention provides a method of connecting dissimilar finite element meshes. A first mesh, designated the master mesh, and a second mesh, designated the slave mesh, each have interface surfaces proximal the other. Each interface surface has a corresponding interface mesh comprising a plurality of interface nodes. Each slave interface node is assigned new coordinates locating the interface node on the interface surface of the master mesh. The slave interface surface is further redefined to be the projection of the slave interface mesh onto the master interface surface.

5 Claims, 6 Drawing Sheets

OTHER PUBLICATIONS

Heinstein et al. "A General–Purpose Contact Detection Algorithm for Nonlinear Structural Analysis Codes." Sandia Report SAND92–2141. Printed: May 1993.*

Farhat and Geradin, "Using a Reduced Number of Lagrange Multipliers for Assembling Parallel Incomplete Field Finite Element Approximations," Computer Methods in Applied Mechanics and Engineering 97, 33–354 (1992).

Aminpour, et al., "A Coupled Analsis Method for Structures with Independently Modelled Finite Element Subdomains," International Journal for Numerical Methods in Engineering, vol. 38, 2695–2718 (1995).

Flanagan and Belytschko., "A Uniform Strain Hexahedron and Quadrilateral with Orthogonal Hourglass Control," International Journal for Numerical Methods in Engineering, vol. 16, 697–706 (1981).

Hughes, The Finite Element Method, Prentice–Hall, Englewood Cliffs, New Jersey (1987).

Szabo and Babuska, Finite Element Analysis, John Wiley & Sons, New York, New York (1991).

* cited by examiner

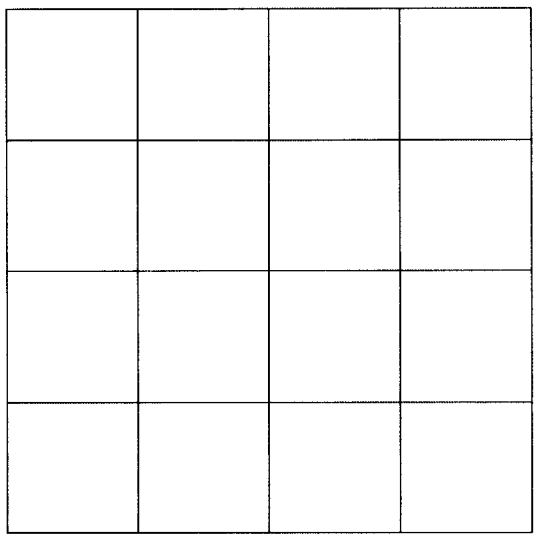
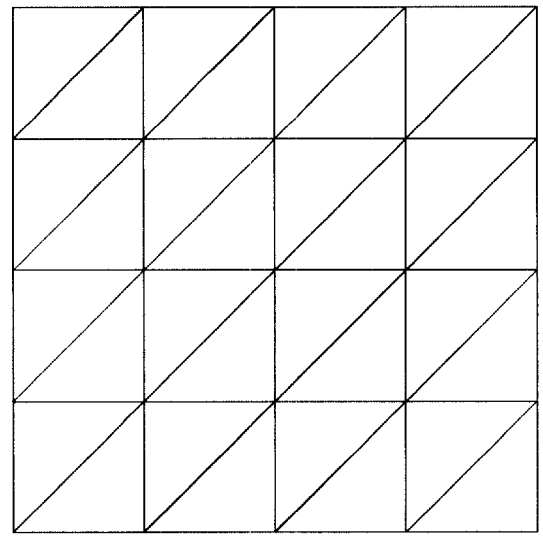
Fig. 4a
Fig. 4b
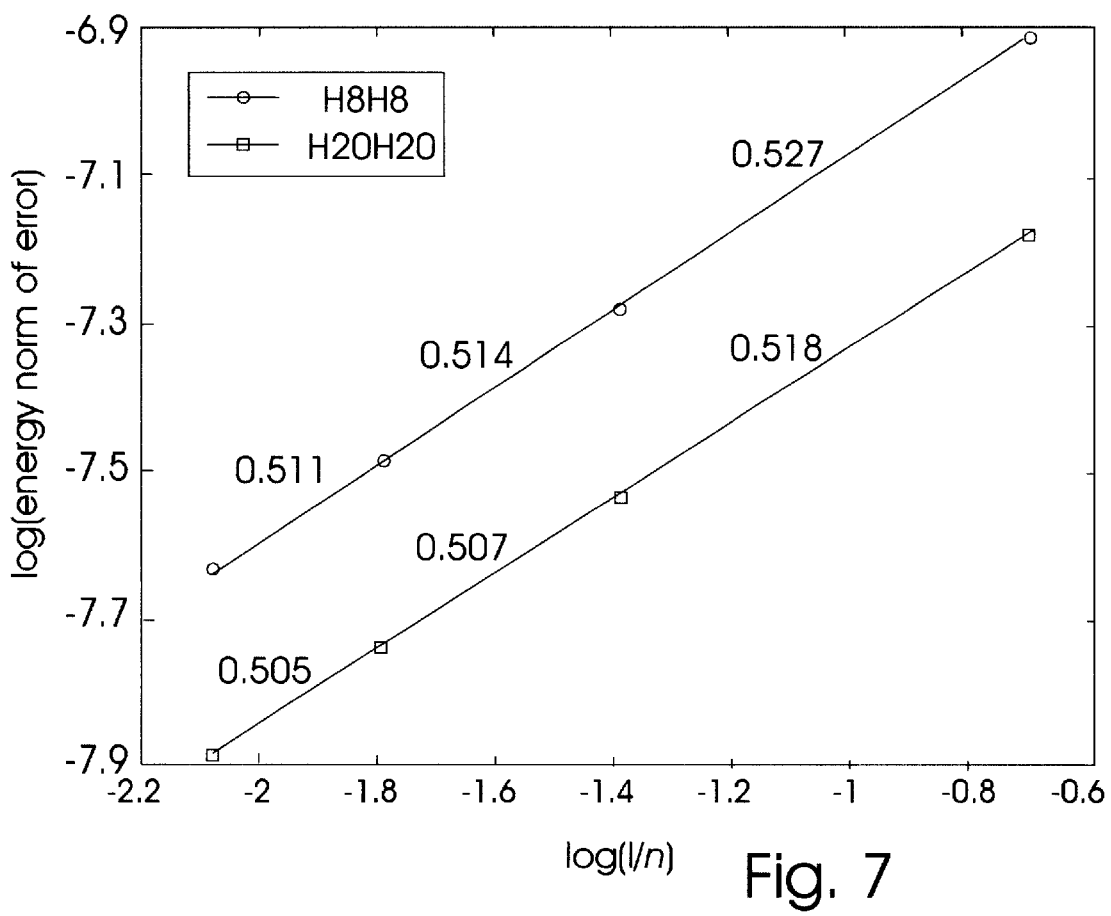
Fig. 7

METHOD AND APPARATUS FOR CONNECTING FINITE ELEMENT MESHES AND PERFORMING SIMULATIONS THEREWITH

This invention was made with Government support under Contract DE-AC04-94AL85000 awarded by the U.S. Department of Energy. The Government has certain rights in the invention.

BACKGROUND OF THE INVENTION

This invention relates to the field of finite element simulations, specifically finite element simulations of problem spaces comprising two regions meshed with non-conforming meshes.

Finite element analysis often requires connection of two meshes at a shared boundary. For example, finite element analysis of a system comprising separate subsystem models can require connection of the subsystem model meshes. One approach to connecting the meshes requires that both meshes have the same number of nodes, the same nodal coordinates, and the same interpolation functions at the shared boundary. If these requirements are met, then the two meshes can be connected simply by equating the degrees of freedom of corresponding nodes at the shared boundary. Ensuring conformity between meshes in this manner can require a significant amount of time and effort in mesh generation.

A simple alternative to such an approach is to use node collocation, also known as tied contact or standard multi-point constraints, to connect the meshes. With this approach, one of the connecting mesh surfaces is designated as the master surface and the other as the slave surface. For problems in solid mechanics, the meshes are connected by constraining nodes on the slave surface to specific points on the master surface at all times. Although this approach is appealing because of its simplicity, overlaps and gaps may develop between the two meshes either because of non-planar initial geometry or non-uniform displacements. For example, a node on the master surface may either penetrate or pull away from the slave surface during deformation even though the slave node constraints are all satisfied. As a result, displacement continuity may hold only at specific points on the master-slave interface.

Dissimilar meshes can also be connected using two-field or three-field hybrid methods. See, e.g., Farhat and Geradin, "Using a Reduced Number of Lagrange Multipliers for Assembling Parallel Incomplete Field Finite Element Approximations", Computer Methods in Applied Mechanics and Engineering 97, 333–354, (1992); Aminpour et al., "A Coupled Analysis Method for Structures with Independently Modelled Finite Element Subdomains", International Journal for Numerical Methods in Engineering 38, 3695–3718 (1995). For two-field methods, the master and slave surface displacements and Lagrange multipliers for constraints between these displacements are considered as field-variables. For three-field methods, the displacement of an interface surface is introduced as an additional field-variable. Discretizations of Lagrange multipliers are required by both methods. For three-field methods, a discretization of the interface displacement is also required. The use of Lagrange multipliers leads to indefinite systems of equations for both methods. As a result, sparse solvers based on the Cholesky decomposition cannot be applied directly to such systems.

Another approach to connecting dissimilar meshes involves defining new shape functions for elements on a slave surface to ensure displacement continuity with the master surface. A specialized application of this approach was used to develop a quadrilateral transition element for mesh refinement. See, e.g., Hughes, The Finite Element Method, Prentice-Hall, Englewood Cliffs, N.J. (1987). A systematic method to generate the new shape functions can be developed based on the concepts of vertex modes, edge modes, and face modes used by the p version of finite elements. See, e.g., Szabo and Babuska, Finite Element Analysis, John Wiley & Sons, New York, N.Y. (1991). Although the new shape functions and their spatial derivatives can be determined in a straightforward manner, it can be very difficult to devise simple and accurate numerical integration rules for the volume integrals defining element matrices. This difficulty is especially evident when two or more faces of an element are connected to a master surface. The major hindrance to the development of the integration rules is the piecewise definition of the new shape functions.

SUMMARY OF THE INVENTION

The present invention provides a method of connecting dissimilar finite element meshes. A first mesh, designated the master mesh, and a second mesh, designated the slave mesh, each have interface surfaces proximal the other. Each interface surface has a corresponding interface mesh comprising a plurality of interface nodes. Each slave interface node is assigned new coordinates locating the interface node on the interface surface of the master mesh. The slave interface surface is further redefined to be the projection of the slave interface mesh onto the master interface surface. The present invention provides the freedom to designate master and slave surfaces independently of the resolutions of the two meshes. Standard practice is to designate the master surface as the surface with fewer numbers of nodes. Improved accuracy can be achieved in certain instances by allowing the master surface to have the greater number of nodes. Methods of mesh refinement based on adaptive subdivision of existing elements can also benefit from this flexibility. For example, kinematic constraints on improper nodes can be removed while preserving the convergence characteristics of adjacent elements.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

FIGS. 4(a,b) depicts slave surface discretizations.

FIG. 7 is a graph of energy norms of the error for an example application.

DETAILED DESCRIPTION OF THE INVENTION

Figure 1:
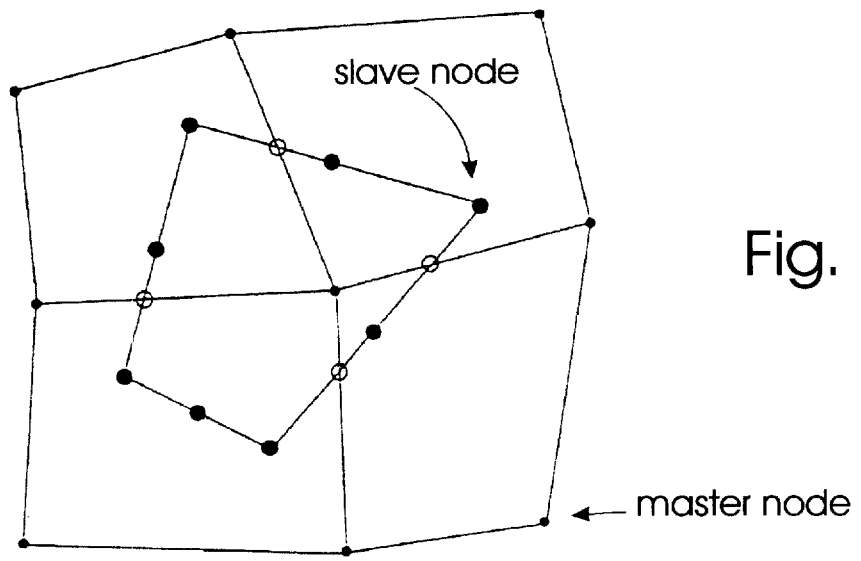
FIG. 1 depicts the projection of slave surface element face $F_1$ onto a master surface.

The present invention provides a method of connecting dissimilar finite element meshes. A first mesh, designated the master mesh, and a second mesh, designated the slave mesh, each have interface surfaces proximal the other. Each interface surface has a corresponding interface mesh comprising a plurality of interface nodes. Each slave interface node is assigned new coordinates locating the interface node on the interface surface of the master mesh. The slave interface surface is further redefined to be the projection of the slave interface mesh onto the master interface surface. The present invention provides the freedom to designate master and slave surfaces independently of the resolutions of the two meshes. Standard practice is to designate the master surface as the surface with fewer numbers of nodes. Improved accuracy can be achieved in certain instances by allowing the master surface to have the greater number of nodes. Methods of mesh refinement based on adaptive subdivision of existing elements can also benefit from this flexibility. For example, kinematic constraints on improper nodes can be removed while preserving the convergence characteristics of adjacent elements.

Context

Consider a generic finite element in three dimensions with nodal coordinates $x_{iI}$ and nodal displacements $u_{iI}$ for $i=1,2,3$ and $I=1, \ldots, N$. The spatial coordinates and displacements of a point in the global coordinate direction $e_i$ are denoted by $x_i$ and $u_i$, respectively. For isoparametric elements, the same interpolation functions are used for the coordinates and displacements, as in equations 1 and 2.

$$x_i = x_{iI}\phi_I(\eta_1, \eta_2, \eta_3) \quad\quad 1$$

$$u_i = u_{iI}\phi_I(\eta_1, \eta_2, \eta_3) \quad\quad 2$$

$\phi_I$ is the shape function of node I and $(\eta_1, \eta_2, \eta_3)$ are isoparametric coordinates. A summation over all possible values of repeated indices in equations 1 and 2 and elsewhere is implied unless noted otherwise.

The Jacobian determinant of the element is defined by equation 3.

$$J = det\begin{bmatrix} \partial x_1/\partial \eta_1 & \partial x_2/\partial \eta_1 & \partial x_3/\partial \eta_1 \\ \partial x_1/\partial \eta_2 & \partial x_2/\partial \eta_2 & \partial x_3/\partial \eta_2 \\ \partial x_1/\partial \eta_3 & \partial x_2/\partial \eta_3 & \partial x_3/\partial \eta_3 \end{bmatrix} \quad\quad 3$$

The volume of the element can be expressed in terms of the Jacobian according to equation 4.

$$V = \int_{V_\eta} J\, dV \quad\quad 4$$

$V_\eta$ is the volume of integration of the element in the isoparametric coordinate system. V is assumed to be a homogeneous function of the nodal coordinates. It is also assumed that a linear displacement field can be expressed exactly in terms of the shape functions. Under these conditions, the uniform strain approach states that the nodal forces $f_{iI}$ associated with element stresses are given by equations 5, 6, and 7. See Flanagan and Belytschko, "A Uniform Strain Hexahedron and Quadrilateral with Orthogonal Hourglass Control", International Journal for Numerical Methods in Engineering 17, 679–706 (1981).

$$f_{jI} = \sigma_{ij} B_{jI} \quad\quad 5$$

$$B_{jI} = \frac{\partial V}{\partial x_{jI}} \quad\quad 6$$

$$V = x_{jI} B_{jI} \text{ for } j=1,2,3 \quad\quad 7$$

$\sigma_{ij}$ are components of the Cauchy stress tensor (assumed constant throughout the element), and there is no summation over the index j in equation 7.

Closed-form expressions for $B_{jI}$ are presented in Flanagan and Belytschko for the 8-node hexahedron. Similar expressions can be derived for other element types, but they can be quite lengthy for higher-order elements. As an alternative to deriving closed-form expressions for specific element types, one can use Gauss quadrature to determine $B_{jI}$ for any isoparametric element in a systematic manner.

Substituting equations 1, 3, and 4 into equation 6 yields equations 8, 9, 10, 11, and 12, giving the functions $g_{jI}$ used by the quadrature rule in evaluating $B_{jI}$.

$$g_{1I} = \phi_{I,1}(x_{2,2}x_{3,3} - x_{3,2}x_{2,3}) + \phi_{I,2}(x_{2,3}x_{3,1} - x_{3,3}x_{2,1}) + \phi_{I,3}(x_{2,1}x_{3,2} - x_{3,1}x_{2,2}) \quad\quad 8$$

$$g_{2I} = \phi_{I,1}(x_{3,2}x_{1,3} - x_{1,2}x_{3,3}) + \phi_{I,2}(x_{3,3}x_{1,1} - x_{1,3}x_{3,1}) + \phi_{I,3}(x_{3,1}x_{1,3} - x_{1,1}x_{3,2}) \quad\quad 9$$

$$g_{3I} = \phi_{I,1}(x_{1,2}x_{2,3} - x_{2,2}x_{1,3}) + \phi_{I,2}(x_{1,3}x_{2,1} - x_{2,3}x_{1,1}) + \phi_{I,3}(x_{1,1}x_{2,2} - x_{2,1}x_{1,2}) \quad\quad 10$$

$$\phi_{I,j} = \partial \phi_I / \partial \eta_j \quad\quad 11$$

$$x_{i,j} = \partial x_i / \partial \eta_j = x_{iI}(\partial \phi_I / \partial \eta_j) \quad\quad 12$$

$g_{jI}$ is evaluated at each of the quadrature points. Exact values of $B_{jI}$ can be obtained using 2-point Gauss quadrature in three dimensions (8 quadrature points total) for the 8-node hexahedron. For the 20-node serendipity or 27-node Lagrange hexahedron, 3-point Gauss quadrature in three dimensions (27 quadrature points total) is required. Exact values for the 4-node linear tetrahedron can be obtained using a 1-point quadrature rule for tetrahedral domains while the 10-node quadratic tetrahedron requires a 5-point quadrature rule. Quadrature rules for integration over tetrahedral domains are available in Hughes.

Following the development in Flanagan and Belytschko leads to equation 13.

$$\int_\Omega \frac{\partial \phi_I}{\partial x_j} dV = B_{jI} \qquad 13$$

$\Omega$ is the domain of the element in the global coordinate system. Based on equation 13, the uniform strain $\epsilon^u$ of the element is expressed in terms of nodal displacements in equations 14, 15, 16, and 17.

$$\varepsilon^u = Cu \qquad 14$$

$$\varepsilon^u = [\varepsilon_{11}^u \quad \varepsilon_{22}^u \quad \varepsilon_{33}^u \quad \gamma_{12}^u \quad \gamma_{23}^u \quad \gamma_{312}^u]^T \qquad 15$$

$$C = \frac{1}{V}\begin{bmatrix} B_{11} & 0 & 0 & B_{12} & 0 & 0 & \ldots & B_{1N} & 0 & 0 \\ 0 & B_{21} & 0 & 0 & B_{22} & 0 & \ldots & 0 & B_{2N} & 0 \\ 0 & 0 & B_{31} & 0 & 0 & B_{32} & \ldots & 0 & 0 & B_{3N} \\ B_{21} & B_{11} & 0 & B_{22} & B_{12} & 0 & \ldots & B_{2N} & B_{1N} & 0 \\ 0 & B_{31} & B_{21} & 0 & B_{32} & B_{22} & \ldots & 0 & B_{3N} & B_{2N} \\ B_{31} & 0 & B_{11} & B_{32} & 0 & B_{21} & \ldots & B_{3N} & 0 & B_{1N} \end{bmatrix} \qquad 16$$

$$u = [u_{11} \quad u_{21} \quad u_{31} \quad u_{12} \quad u_{22} \quad u_{32} \quad \ldots \quad u_{1N} \quad u_{2N} \quad u_{3N}]^T \qquad 17$$

Elements based on the uniform strain approach have the appealing feature that they pass first-order patch tests.

Boundaries of three-dimensional elements are defined either by planar or curved faces. Elements with interpolation functions that vary linearly, e.g. the 4-node tetrahedron, have planar faces. In contrast, elements with higher-order interpolation functions, e.g. the 8-node hexahedron and 10-node tetrahedron, generally have curved faces. That being the case, it is not necessarily obvious how to connect two meshes of elements which use different orders of interpolation along their boundaries.

Difficulties can arise using node collocation even if the boundaries of both meshes are defined by planar faces. As was mentioned previously, even though the slave nodes stay attached to the master surface, there may not be any constraints to keep a node on the master surface from penetrating or pulling away from the slave surface. Such problems can be addressed by requiring the faces of elements on the slave boundary to always conform to the master surface. In order to explain how this is done, some preliminary geometric concepts are introduced first.

Notice from equations 6, 14, and 16 that the relationship between strain and displacement for a uniform strain element is defined completely by its volume. Consequently, the uniform strain characteristics of two elements are identical if the expressions for their volumes are the same. This fact is important because it allows one to consider alternative interpolation functions for elements with faces on the master and slave surfaces. By doing so, one can interpret the present method as an approach for generating "conforming" finite elements at the shared boundary by carefully accounting for the volume (positive or negative) that exists due to an imperfect match between the two meshes both initially and during deformation.

Consider an 8-node hexahedral element whose six faces are not necessarily planar. Each point on a face of the element is associated with specific values of two isoparametric coordinates. Both the spatial coordinates and displacements of the point are linear functions of the coordinates and displacements of the four nodes defining the face. The specific forms of these relationships are obtained by setting any of $\eta_1, \eta_2, \eta_3$ equal to one of its bounding values in equations 1 and 2.

Consider now an alternative element in which each face of the original 8-node hexahedron is triangulated with $n_t$ facets. Each vertex of a triangular facet intersects one of the curved faces of the hexahedron. A center node c is introduced in the interior of the element. Although the precise location of c is not important, its coordinates can be expressed in terms of those of the hexahedron nodes as in equation 18.

$$x_{ic} = \sum_{l=1}^{8} x_{il}/8 \qquad 18$$

The center node along with the three vertices of each triangular facet form the vertices of a 4-node tetrahedron. Thus, the domain of the hexahedron can be divided into $6n_t$ tetrahedral regions. Within each of these regions the interpolation functions are linear. In other words, the displacement of a point in a tetrahedral region is determined by its location and the displacements of the four points defining the tetrahedron. One may approximate the boundary of the original hexahedron to any level of accuracy by increasing the number of triangular facets.

Although the two elements described in the previous paragraphs are significantly different, their uniform strain characteristics are approximately the same. In the limit as $n_t$ approaches infinity, the uniform strain characteristics of the two elements are identical. By viewing all the element faces on the master and slave surfaces as connected triangular facets, one can develop a systematic method for connecting the two meshes that passes first-order patch tests. Note that the alternative element satisfies the basic assumptions of the uniform strain approach. That is, the element volume is a homogeneous function of the nodal coordinates and a linear displacement field can be expressed exactly in terms of the interpolation functions.

Method

Changes to elements with faces on the master surface are not required. The concept of alternative piecewise-linear interpolation functions was introduced in the previous paragraphs to facilitate interpretation of the method as a means for generating conforming elements at the master-slave interface. These alternative interpolation functions are never used explicitly to modify the element formulations.

FIG. 1 depicts the projection of slave surface element face $F_1$ onto a master surface. The larger filled circles designate nodes on the slave surface constrained to the master surface. Smaller filled circles designate nodes on the master surface. Circles that are not filled designate the projections of slave element edges onto master element edges.

There are several options for projecting slave element entities onto the master surface. For example, nodes on the slave surface that are initially off the master surface can be repositioned to specific points on the master surface based on a minimum distance criterion. That is, a node on the slave surface can be moved and constrained to the nearest point on the master surface. For each element face of the slave surface, one can define a normal direction at the center of the face. If an element edge of the slave surface is shared by two elements, the normal direction for the edge is defined as the average of the two elements sharing the edge. Otherwise, the normal direction is chosen as that of the single element containing the edge. A plane can be constructed which contains two nodes of the slave element edge and has a normal in the direction of the cross product of the element edge and the element edge normal. The projection of the slave element edge onto a master element edge is simply the intersection of this plane with the master element edge.

Let P denote the element face of the master surface onto which a node S of the slave surface is projected. The projection of S onto P can be characterized by two isoparametric coordinate values $\eta_{1S}$ and $\eta_{2S}$. As a result of constraining S to P, the spatial coordinates of S are expressed in equation 19, where K ranges over all the nodes defining P.

$$x_{iS} = x_{iK} a_{KS} \qquad 19$$

The coefficients $a_{KS}$ in equation 19 can be expressed in terms of $\eta_{1S}$ and $\eta_{2S}$ by equation 20, where $\phi_K^P$ is the shape function of node K on face P.

$$a_{KS} = \phi_K^P(\eta_{1S}, \eta_{2S}) \qquad 20$$

The following development replaces $F_1$ with a new boundary that prevents the possibility for overlaps or gaps between the two meshes. The new boundary is composed of two parts. The first part is denoted by $F_m$ and consists of the projection of $F_1$ onto the master surface (see FIG. 1). In FIG. 1, larger filled circles designate nodes on the slave surface constrained to the master surface. Smaller filled circles designate nodes on the master surface. Circles that are not filled designate the projections of slave element edges onto master element edges. The second part is denoted by $F_r$ and consists of ruled surfaces between the edges of $F_1$ and their projections onto the master surface.

Using the divergence theorem, element volume can be expressed in terms of surface integrals over the faces of the element as in equation 21. In equation 21, $N_f$ is the number of element faces; $F_k$ denotes face k; and $n^k = n_j^k e_j$ is the unit outward normal to $F_k$.

$$V = \sum_{k=1}^{N_f} \int_{F_k} x_j n_j^k \, dS \text{ for } j = 1, 2, 3 \qquad 21$$

Let $\hat{V}$ denote the volume of a uniform strain element obtained by replacing $F_1$ with the new boundary. Equation 22 then follows from equation 21. In equation 22, $n^m = n_j^m e_j$ is the unit outward normal to $F_m$ and $n^r = n_j^r e_j$ is the unit outward normal to $F_r$.

$$\hat{V} = V - \int_{F_1} x_j n_j^1 \, dS - \int_{F_m} x_j n_j^m \, dS + \int_{F_r} x_j n_j^r \, dS \text{ for } j = 1, 2, 3 \qquad 22$$

Notice that a negative sign is assigned to the third term on the right hand side of equation 22 because $n^m$ points into the slave element. The analog to equation 6 for the uniform strain element is given by equation 23.

$$\hat{B}_{j\hat{I}} = \frac{\partial \hat{V}}{\partial x_{j\hat{I}}} \qquad 23$$

The index $\hat{I}$ is used instead of I in equation 23 to remind the reader that $\hat{V}$ depends on the coordinates of the original element nodes as well as the nodes defining $F_m$. To be specific, the index $\hat{I}$ takes on all values of I for the original element except the numbers of nodes constrained to the master surface. In addition, $\hat{I}$ takes on the numbers of all nodes defining $F_m$.

Substituting equations 19 and 22 into equation 23 yields equations 24–28, where $\delta$ is the Kronecker delta symbol.

$$\hat{B}_{j\hat{I}} = B_{j\hat{I}} \delta_{I\hat{I}} + [(B_{jS}^r - B_{jS}^1) a_{MS} + B_{jM}^r - B_{jM}^m] \delta_{M\hat{I}} \qquad 24$$

for $j = 1, 2, 3$ $$B_{jS}^r = \frac{\partial}{\partial x_{jS}} \int_{F_r} x_j n_j^r \, dS \qquad 25$$

$$B_{jS}^1 = \frac{\partial}{\partial x_{jS}} \int_{F_1} x_j n_j^1 \, dS \qquad 26$$

$$B_{jM}^r = \frac{\partial}{\partial x_{jM}} \int_{F_r} x_j n_j^r \, dS \qquad 27$$

$$B_{jM}^m = \frac{\partial}{\partial x_{jM}} \int_{F_m} x_j n_j^m \, dS \qquad 28$$

The indices M and S take on the numbers of nodes defining $F_m$ and $F_1$, respectively. Thus, $\delta_{M\hat{I}}$ is zero if $\hat{I}$ refers to a node number of the original element. The surface integrals on the right hand sides of equations 25–28 can be calculated using numerical integration as described in the following paragraphs.

The coordinates of points on $F_1$ can be expressed as in equation 29, where $\phi_S$ is the shape function of node S on $F_1$.

$$x_i^1 = x_{iS} \phi_S(\eta_1, \eta_2) \qquad 29$$

Using a fundamental result for surface integrals together with equations 26 and 29 leads to equation 30.

$$B_{jS}^1 = \int_{A_{\eta 1}} \phi_S \varepsilon_{jkm} x_{k,1} x_{m,2} \, dA \text{ for } j = 1, 2, 3 \qquad 30$$

In equation 30, $\varepsilon_{jkm}$ is the permutation symbol and $A_{\eta 1}$ is the area of integration for $F_1$ in the $\eta_1$–$\eta_2$ coordinate system. Exact expressions for the right hand side of equation 30 can be obtained using 2-point Gauss quadrature in two dimensions (4 quadrature points total) for the 8-node hexahedron. For the 20-node and 27-node hexahedron, 3-point Gauss quadrature in two dimensions (9 quadrature points total) is required. Exact expressions for the 4-node tetrahedron can be obtained using a 1-point quadrature rule for triangular domains while the 10-node tetrahedron requires a 7-point quadrature rule. Quadrature rules for integration over triangular domains are known in the art. See, e.g., Hughes.

Figure 2:
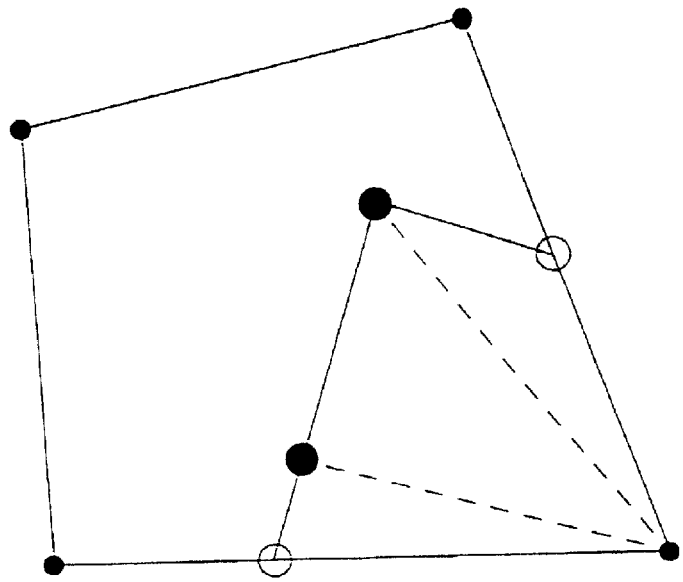
FIG. 2 depicts the projection of $F_1$ onto an element face of the master surface.

The projection of $F_1$ onto an element face of the master surface is shown in FIG. 2. In the coordinate system of the element face, the triangular regions have straight edges and lie in a single plane. The domain of the projection of $F_1$ onto the element face is divided into triangular regions to automate the calculation of surface integrals over $F_m$. For each such master element face, the boundary of the projection is defined by a closed polygon consisting of straight-line segments in the isoparametric coordinate system of the master element face. This polygon is decomposed into triangular regions (again in the isoparametric coordinate system of the master element face) as shown to facilitate the calculation of surface integrals.

The coordinates of points on the element face can be expressed as in equation 31, wherein $\phi_M$ is the shape function of node M on the master element face.

$$x_i^M = x_{iM} \phi_M(\eta_1, \eta_2) \qquad 31$$

Equation 31 leads to equation 32.

$$\frac{\partial}{\partial x_{jM}} \int_{F_{1f}} x_j^M n_1^j \, dS = \int_{A_{\eta f}} \phi_M \varepsilon_{jkm} x_{k,1} x_{m,2} \, dA \text{ for } j = 1, 2, 3 \quad 32$$

In equation 32, $F_{1f}$ denotes the projection of $F_1$ onto the master element face and $A_{\eta f}$ is the area of integration of this face in the $\eta_1$-$\eta_2$ coordinate system. The integral on the right hand side of equation 32 is determined by adding the contributions from each triangular region. The surface integrals can be calculated exactly for each triangular region by using the following quadrature rules for triangular domains: 1-point for 4-node tetrahedron, 4-point for 8-node hexahedron, 7-point for 10-node tetrahedron, 13-point for 20-node hexahedron, and 19-point for 27-node hexahedron. The surface integral in equation 28 over the domain $F_m$ is obtained from equation 32 by summing the contributions from all involved element faces on the master surface.

Figure 3:
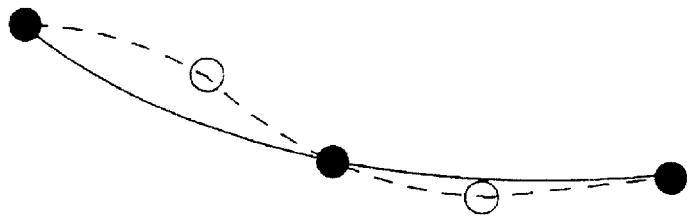
FIG. 3 depicts an edge of $F_1$ and its projection onto the master surface.

Recall that the second part of the boundary to replace $F_1$ consists of ruled surfaces between the edges of $F_1$ and their projections onto the master surface. By including these surfaces, the "new boundary" of the slave element is ensured to be closed. An edge of $F_1$ (solid line) and its projection onto the master surface (dashed line) is shown in FIG. 3. The edge shown spans three different element faces on the master surface. The projection of the edge into the master surface is a piecewise continuous line with possible discontinuities in slope at edges on the master surface. The solid and dashed lines appear as straight lines in the coordinate systems of element faces on the slave and master surfaces, respectively. The spatial coordinates of points along the edge can be expressed as in equation 33, wherein $\phi_{Se}$ is the shape function of node S on the edge of interest.

$$x_{ie} = x_{iS} \phi_{Se}(\xi_2) \quad 33$$

The projection of the edge onto a participating element face of the master surface appears as one or more connected straight-line segments in the coordinate system of the element face. For each such segment, the isoparametric coordinates of points along the segment can be expressed as in equation 34 and 35.

$$\eta_1 = a_1 + b_1 \xi_2 \quad 34$$

$$\eta_2 = a_2 + b_2 \xi_2 \quad 35$$

The coefficients a and b appearing in equations 34 and 35 are determined from the projections of nodes and edges of $F_1$ described previously. Thus, the spatial coordinates of points along the segment can be expressed as in equation 36, wherein $\phi_M$ is the shape function of node M on the element face.

$$x_{ig} = x_{iM} \phi_M(a_1 + b_1 \xi_2, a_2 + b_2 \xi_2) \quad 36$$

The ruled surface between the segment and the edge is denoted by $F_{ge}$. Spatial coordinates of points on this surface are given by equation 37, wherein $0 \leq \xi_1 > 1$.

$$x_i^r = (1 - \xi_1) x_{ig} + \xi_1 x_{ie} \quad 37$$

The bounding values of $\xi_2$ which define $F_{ge}$ are determined from the projections described previously. Equations 38–41, wherein $A_{\xi_r}$ is the area of integration for $F_{ge}$ in the $\xi_1$-$\xi_2$ coordinate system, follow from equations 33–37.

$$\frac{\partial}{\partial x_{jM}} \int_{F_{ge}} x_j^r n_j^r \, dS = \int_{A_{\xi_r}} \phi_M \varepsilon_{jkm} \tilde{x}_{k,1} \tilde{x}_{m,2} (10 - \xi_1) \, dA \text{ for } j = 1, 2, 3 \quad 38$$

$$\frac{\partial}{\partial x_{jS}} \int_{F_{ge}} x_j^r n_j^r \, dS = \int_{A_{\xi_r}} \phi_M \varepsilon_{jkm} \tilde{x}_{k,1} \tilde{x}_{m,2} \xi_1 \, dA \text{ for } j = 1, 2, 3 \quad 39$$

$$\tilde{x}_{i,1} = x_{iS} \phi_{Se} - x_{im} \phi_M (a_1 + b_1 \xi_2, a_2 + b_2 \xi_2) \quad 40$$

$$\tilde{x}_{i,2} = x_{iM} \phi_M [(\partial \phi_M / \partial \eta_1) b_1 + (\partial \phi_M / \partial \eta_2) b_2](1 - \xi_1) + x_{iS} (\partial \phi_{Se} / \partial \xi_2) \xi_1 \quad 41$$

The integrals on the right hand sides of equations 38 and 39 can be calculated exactly using a 2-point Gauss quadrature rule in the $\xi_1$ direction. For edges on the slave surface with three or fewer nodes, the following quadrature rules for the $\xi_2$ direction are sufficient: 3-point for a 4-node tetrahedron or 8-node hexahedron with a face on the master surface, 4-point for a 6-node tetrahedron or a 20-node hexahedron, and 6-point for a 27-node hexahedron. The surface integrals in equations 25 and 27 over the domain $F_r$ are obtained from equations 38 and 39 by summing the contributions of all involved segments on the master surface.

If the slave surface consists entirely of uniform strain elements, e.g. the uniform strain hexahedron or 4-node tetrahedron, then all the necessary corrections are contained in $\hat{B}_{jI}$. By using equation 24 to calculate $\hat{B}_{jI}$ for elements with faces on the slave surface, one can perform analyses of connected meshes for both linear and nonlinear problems. A general method of hourglass control known in the art can also be used to stabilize any elements on the boundary with spurious zero energy deformation modes.

The remainder of this section is concerned with extending the method to accommodate more commonly used finite elements on the slave surface. Attention is restricted to linear problems at this point in the development. Prior to any modifications, the stiffness matrix K of an element with a face on the slave surface can be expressed as in equation 42.

$$K = K_u + K_r \quad 42$$

In equation 42, $K_u$ denotes the uniform strain portion of K and $K_r$ is the remainder. The matrix $K_u$ is defined in equation 43, wherein D is a material matrix that is assumed constant throughout the element.

$$K_u = V C^T D C \quad 43$$

Recall that V is the element volume and C is given by equation 16. The splitting of the stiffness matrix in equation 42 is similar to that of the free formulation known in the art where $K_u$ is called the basic stiffness and $K_r$ the higher order stiffness.

Substituting equation 43 into equation 42 and solving for $K_r$ yields equation 44.

$$K_r = K - V C^T D C \quad 44$$

Let $u^l$ denote the vector u (see equation 17) obtained by sampling a linear displacement field at the nodes. The nodal forces $f^l$ associated with $u^l$ are given by equation 45.

$$f^l = K u^l \quad 45$$

For a properly formulated element, equations 46 and 47 hold.

$$K_u u^l = f^l \qquad (46)$$

$$K_r u^l = 0 \qquad (47)$$

If equation 46 does not hold, then $K_u u^{l \neq f l}$ and elements based on the uniform strain approach would fail a first-order patch test. Equation 47 implies that $K_r$ does not contribute to the nodal forces for linear displacement fields.

The basic idea of the following development is to alter the uniform strain portion of the stiffness matrix while leaving $K_r$ unchanged. Let $\hat{u}$ denote the displacement vector for nodes associated with the index $\hat{I}$ (see discussion following equation 23). Based on the constraints in equation 19, one may express u in terms of $\hat{u}$ as in equation 48, wherein G is a transformation matrix.

$$u = G\hat{u} \qquad (48)$$

The modified stiffness matrix $\hat{K}$ of the element is defined in equation 49.

$$\hat{K} = \hat{V}\hat{C}^T D \hat{C} + G^T K_r G \qquad (49)$$

In equation 49, $\hat{C}$ denotes the matrix C (see equation 16) associated with $\hat{B}_{j\hat{I}}$ (see equation 24). The stiffness matrix $K_{nc}$ obtained using standard node collocation with the master-slave approach is given by equation 50.

$$K_{nc} = G^T K G \qquad (50)$$

Equation 51 compares $\hat{K}$ with $K_{nc}$.

$$\hat{K} - K_{nc} = \hat{V}\hat{C}^T D \hat{C} - G^T (V C^T D C) G \qquad (51)$$

The right hand side of equation 51 is simply the difference between the uniform strain portions of $\hat{K}$ and $K_{nc}$. If continuity at the master-slave interface holds by satisfying equation 48 alone, it follows that $\hat{K} = K_{nc}$. Thus, under such conditions, the method and node collocation are equivalent.

Prior to element modifications, the strain $\epsilon$ in an element on the slave surface can be expressed as in equation 52, wherein where Cu is the uniform strain (see equation 14) and Hu is the remainder.

$$\epsilon = Cu + Hu \qquad (52)$$

The modified element strain $\hat{\epsilon}$ is defined by equation 53.

$$\hat{\epsilon} = \hat{C}\hat{u} + Hu \qquad (53)$$

Equation 53 is used to calculate the strains in elements with faces on the slave surface. One might erroneously consider developing a modified stiffness matrix $\hat{K}_\epsilon$ based on equation 53. The result is in equation 54, wherein $\hat{\Omega}$ denotes the domain of the element with face $F_1$ replaced by the new boundary.

$$\hat{K}_\epsilon = \hat{V}\hat{C}^T DC + \int_{\hat{\Omega}} [\hat{C}^T DHG + G^T H^T D\hat{C} + G^T DHG] dV \qquad (54)$$

The difficulties with using $\hat{K}_\epsilon$ for an element stiffness matrix are twofold. First, it may not be simple to evaluate the integral in equation 54 because the domain $\hat{\Omega}$ could be irregular. Second, and more importantly, such an element formulation does not pass the patch test. To explain this fact, let $\hat{u}^l$ denote the vector $\hat{u}$ obtained by sampling a linear displacement field. In general, one has $\hat{K}\hat{u}^l \neq \hat{K}_\epsilon \hat{u}^l$ since the product $\hat{C}\hat{u}^l$ is not necessarily zero.

Accordingly, the method alters the formulations of elements on the slave surface by accounting for the volume between the two meshes that is present either initially or during deformation. As a result, meshes connected in this manner pass first-order patch tests.

EXAMPLE IMPLEMENTATION

Figure 8:
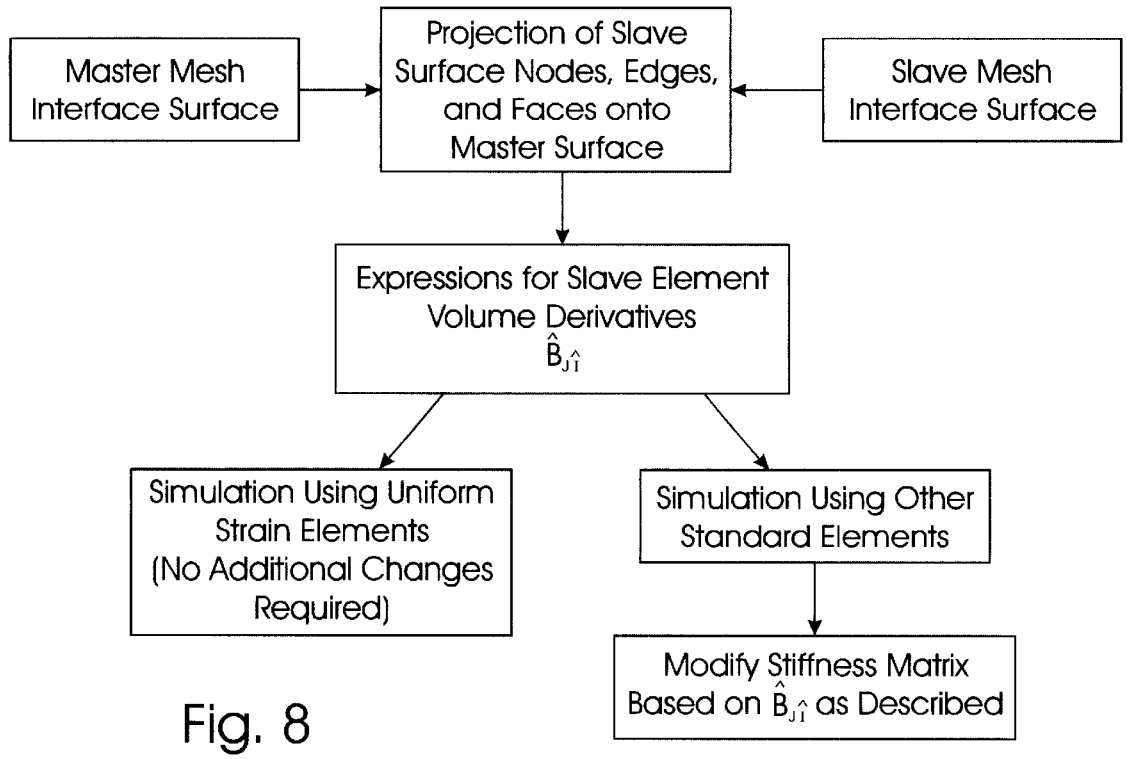
FIG. 8 is a flow diagram corresponding to an example implementation of the present invention.

The present invention can be implemented and practiced using software development practices known to those skilled in the art. A flow diagram corresponding to example software implementation of the present invention is shown in FIG. 8.

The present invention was implemented in the Matlab™ computing environment. One routine was used to determine the projection of slave element nodes, edges, and faces onto the master surface. Another routine was used to calculate the volume derivatives $\hat{B}_{j\hat{I}}$. A third routine was used to make modifications to slave element stiffness matrices and assemble and solve the resulting system of linear equations.

EXAMPLES

All the example problems in this section assume small deformations of a linear, elastic, isotropic material with Young's modulus $E = 10^7$ and Poisson's ratio $v = 0.3$. In this case, the material matrix D is given by equations 71 and 72.

$$D = \begin{bmatrix} 2G+\lambda & \lambda & \lambda & 0 & 0 & 0 \\ \lambda & 2G+\lambda & \lambda & 0 & 0 & 0 \\ \lambda & \lambda & 2G+\lambda & 0 & 0 & 0 \\ 0 & 0 & 0 & G & 0 & 0 \\ 0 & 0 & 0 & 0 & G & 0 \\ 0 & 0 & 0 & 0 & 0 & G \end{bmatrix} \qquad (71)$$

$$G = \frac{E}{2(1+v)}; \quad \lambda = \frac{Ev}{(1+v)(1-2v)} \qquad (72)$$

Five different element types are considered in the example problems. These include the standard 4-node tetrahedron (T4), eight-node hexahedron (H8), ten-node tetrahedron (T10), 20-node hexahedron (H20), and 27-node hexahedron (H27). Stiffness matrices of the various elements are calculated using numerical integration. The following quadrature rules in three dimensions are used for the hexahedral elements: 2-point for 8-node hexahedron, 3-point for 20-node hexahedron, and 3-point for 27-node hexahedron. Single-point and 5-point quadrature rules for tetrahedral domains are used for element types T4 and Ti 0, respectively.

Figure 5A:
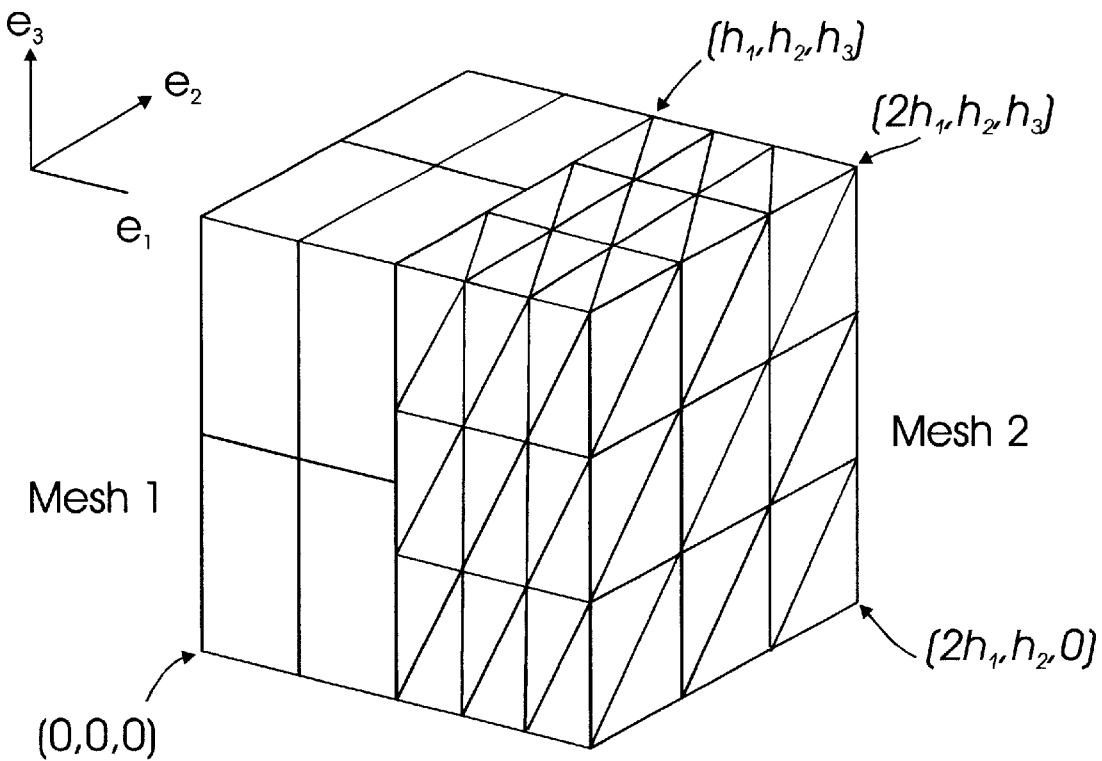
FIGS. 5(a,b) depicts mesh configuration H8T4.
Figure 5B:
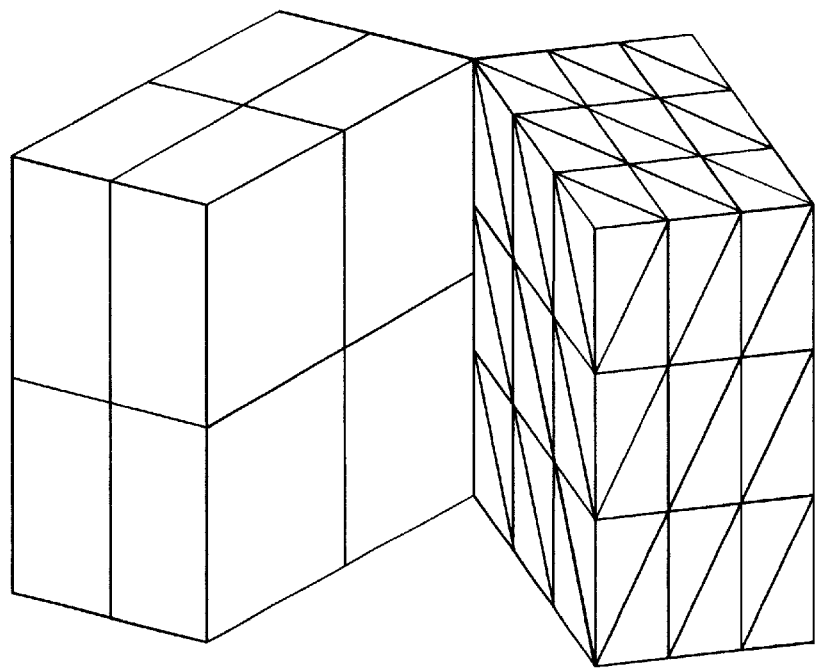

Two meshes connected at a shared boundary are used in all the example problems. Mesh 1 is initially bounded by the six sides $x_1=0$, $x_1=h_1$, $x_2=0$, $x_2=h_2$, $x_3=0$ and $x_3=h_3$ while Mesh 2 is initially bounded by $x_1=h_1$, $x_1=2h_1$, $x_2=0$, $x_2=h_2$, $x_3=0$ and $x_3=h_3$ (see FIG. 5). Each mesh consists of one of the element types described in the previous paragraph. The number of element edges in direction i for mesh m is designated by $n_{im}$. Thus, all the meshes in FIG. 4 have $n_{11}=n_{21}=n_{31}=2$ and $n_{12}=n_{22}=n_{32}=3$. Specific mesh configurations are designated by the element type for Mesh 1 followed by the element type for Mesh 2.

Calculated values of the energy norm of the error are presented for purposes of comparison and for the investi gation of convergence rates. The energy norm of the error is a measure of the accuracy of a finite element approximation and is defined as in equation 73, wherein $\Omega_k$ is the domain of element k and $\epsilon^{fe}$ and $\epsilon^{exact}$ denote the finite element and exact strains, respectively.

$$e = \left[ \sum_{k \in I} \int_{\Omega_k} (\varepsilon^{fe} - \varepsilon^{exact})^T D(\varepsilon^{fe} - \varepsilon^{exact}) dV \right]^{1/2} \qquad 73$$

The symbol I denotes the set of all element numbers for the two meshes. Calculation of energy norms for hexahedral and tetrahedral elements is based on the quadrature rules for element types H20 and T10, respectively.

EXAMPLE

The first example focuses on a uniaxial tension patch test and highlights some differences between standard node collocation and the present methods. The boundary conditions for the problem are given by equations 74 and 75.

$$u_1(0,x_2,x_3)=0;\ u_2(0,0,0)=0;\ u_3(0,0,0)=0;\ u_3(0,h_2,0) \qquad 74$$

$$\sigma_{11}(2h_1, x_2, x_3)=1 \qquad 75$$

The exact solution for displacement is given by equation 76.

$$u_1(x_1,x_2,x_3)=x_1/E;\ u_2(x_1,x_2,x_3)=-vx_2/E;\ u_3(x_1,x_2,x_3)=-vx_3/E \qquad 76$$

All the meshes used in the example have $h_1=5$, $h_2=10$, $h_3=10$, $n_{11}=n_{21}=n_{31}=n$ and $n_{12}=n_{22}=n_{32}=3n/2$ where n is a positive even integer.

Figure 6:
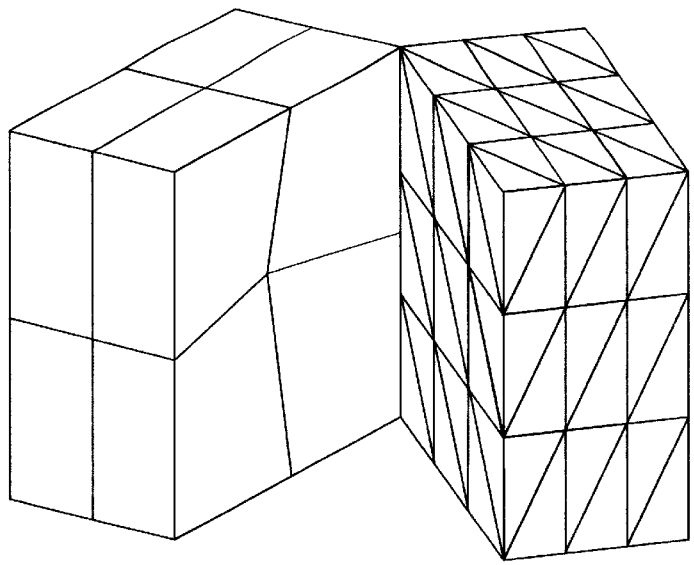
FIG. 6 is an opened view of mesh configuration H8T4 with distorted elements.

Several analyses with n=2 were performed to evaluate the method. Using all five element types for Mesh 1 and Mesh 2 resulted in 25 different mesh configurations. Nodes internal to the meshes and along the master-slave interface were moved randomly so that all the elements were initially distorted. Following the initial movement of nodes, the nodes on the slave surface were repositioned and constrained to specific points on the master surface. It is noted that gaps and overlaps still remained between the two meshes after repositioning the slave surface nodes (see FIG. 6). The two meshes were alternately designated as master and slave. In all cases the patch test was passed using the method. That is, the calculated element stresses and nodal displacements were in agreement with the exact solution to machine precision.

The final part of this example concerns results for node collocation with Mesh 1 designated as master. In all cases the mesh geometries are regular with connected surfaces that conform initially and are planar (see FIGS. 5(a,b)). The minimum and maximum values of $\sigma_{11}$ at centroids of elements with faces on the slave surface are shown in Table 1 for mesh configurations T4T4, H8H8, T10T10 and H20H20 for a variety of mesh resolutions. The exact value of $\sigma_{11}$ was 1.0. Although not shown, the errors in stress are even greater at integration points nearest the interface for mesh configurations H8H8, T10T10 and H20H20. It is clear from the table that refinement of the meshes does not improve the accuracy of the solution at the shared boundary. The fact that node collocation can fail to represent correctly a constant pressure transfer was also recognized in the related context of contact problems.

TABLE 1

|   | T4T4 | | H8H8 | | T10T10 | | H20H20 | |
|---|---|---|---|---|---|---|---|---|
| n | min | max | min | max | min | max | min | max |
| 2 | 0.7872 | 1.1350 | 0.9406 | 1.1196 | 0.7898 | 1.1082 | 0.7697 | 1.1009 |
| 4 | 0.7689 | 1.1649 | 0.9313 | 1.1298 | 0.7858 | 1.1209 | 0.7644 | 1.1064 |
| 6 | 0.7651 | 1.1687 | 0.9305 | 1.1294 | 0.7854 | 1.1208 | 0.7642 | 1.1061 |
| 8 | 0.7639 | 1.1694 | 0.9304 | 1.1292 | 0.7854 | 1.1208 | 0.7642 | 1.1061 |

Plots of the energy norm of the error for mesh configurations H8H8 and H20H20 are shown in FIG. 7 for node collocation. It is clear that the energy norms decrease with mesh refinement, but the convergence rates are significantly lower than those expected for elements in a single unconnected mesh. The slopes of lines connecting the first two data points are approximately 0.51 and 0.50 for H8H8 and H20H20, respectively. In contrast, the energy norms of the error for a single mesh of H8 or undistorted H20 elements have slopes that asymptotically approach 1 and 2, respectively, in the absence of singularities. The fact that displacement continuity is not satisfied at the shared boundary severely degrades the convergence characteristics of the connected meshes for node collocation.

EXAMPLE

This example focuses on a second-order patch test involving pure bending. The problem description is identical to the first example with the exception that the boundary condition at $x_1=2h_1$ is replaced by equation 77.

$$\sigma_{11}(2h_1,x_2,x_3)=h_2/2-x_2 \qquad 77$$

The exact solution has all of the stress components equal to zero except for $\sigma_{11}$ which is given by equation 78.

$$\sigma_{11}(x_1,x_2,x_3)=h_2/2-x_2 \qquad 78$$

In all cases Mesh 1 was designated as master.

Figure 9:
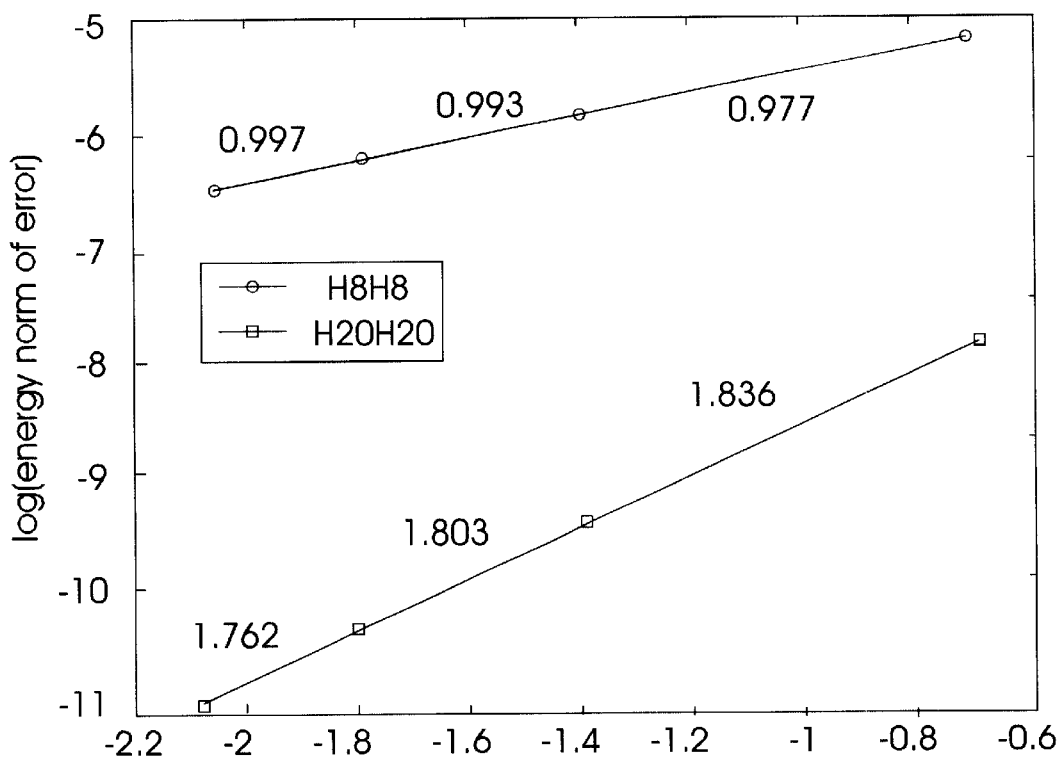
FIG. 9 is a graph of energy norms of the error for an example application.

Plots of the energy norm of the error for Method 1 are shown in FIG. 9 for mesh configurations H8H8 and H20H20. The slopes of lines connecting the first two data points are approximately 1.00 and 1.76 for H8H8 and H20H20, respectively. Notice that a convergence rate of unity is achieved by mesh configuration H8H8. Although the slopes of line segments are greater for mesh configuration H20H20, the optimal slope of 2 is not achieved. One should not expect to obtain a convergence rate of 2 with Method 1 because corrections are made only to satisfy first-order patch tests. Nevertheless, the results for mesh configuration H20H20 are more accurate than those for H8H8. Although the asymptotic rate of convergence for H20H20 is not clear from the figure, it is bounded below by unity. Similar results are obtained using Option 1 of Method 2. Exact results are obtained using Option 2 of Method 2 for all possible mesh configurations of quadratic elements. This is true because both of the meshes individually pass second-order patch tests and the connected surfaces are initially coplanar.

EXAMPLE

The final example demonstrates the freedom to designate master and slave surfaces independently of the resolutions of the two meshes. We consider again a problem of pure bending for mesh configuration H8H8 with Mesh 1 designated as master. The boundary conditions are given by equations 79 and 80.

$$u_2(x_1,x_2,x_3)=0; u_3(0,0,0)=0; \ u_1(0,0,0)=0; u_1(0,0,h_3)=0 \qquad 79$$

$$\sigma_{22}(x_1,h_2,x_3)=h_1-x_1 \qquad 80$$

The exact solution has all of the stress components equal to zero except for $\sigma_{22}$ which is given by equation 81.

$$\sigma_{22}(x_1,x_2,x_3)=h_1-x_1 \qquad 81$$

All the meshes used in the example have $h_1=1$, $h_2=10$, $h_3=1$, $n_{11}=n_{12}=n$ and $n_{31}=n_{32}=n$. Two different cases are considered for the mesh resolutions in the 2-direction. For Case 1, $n_{21}=5n$ and $n_{22}=10n$. For Case 2, $n_{21}=10$ and $n_{22}=5n$. Thus, for Case 1 the mesh resolution in the 2-direction of the slave surface is twice that of the master surface. In contrast, the mesh resolution in the 2-direction of the master surface is twice that of the slave surface for Case 2. Mesh resolutions in the 1 and 3 directions for Meshes 1 and 2 are the same for both cases. Results for Case 1 are identical to those obtained using node collocation since the meshes are conforming in this case.

Figure 10:
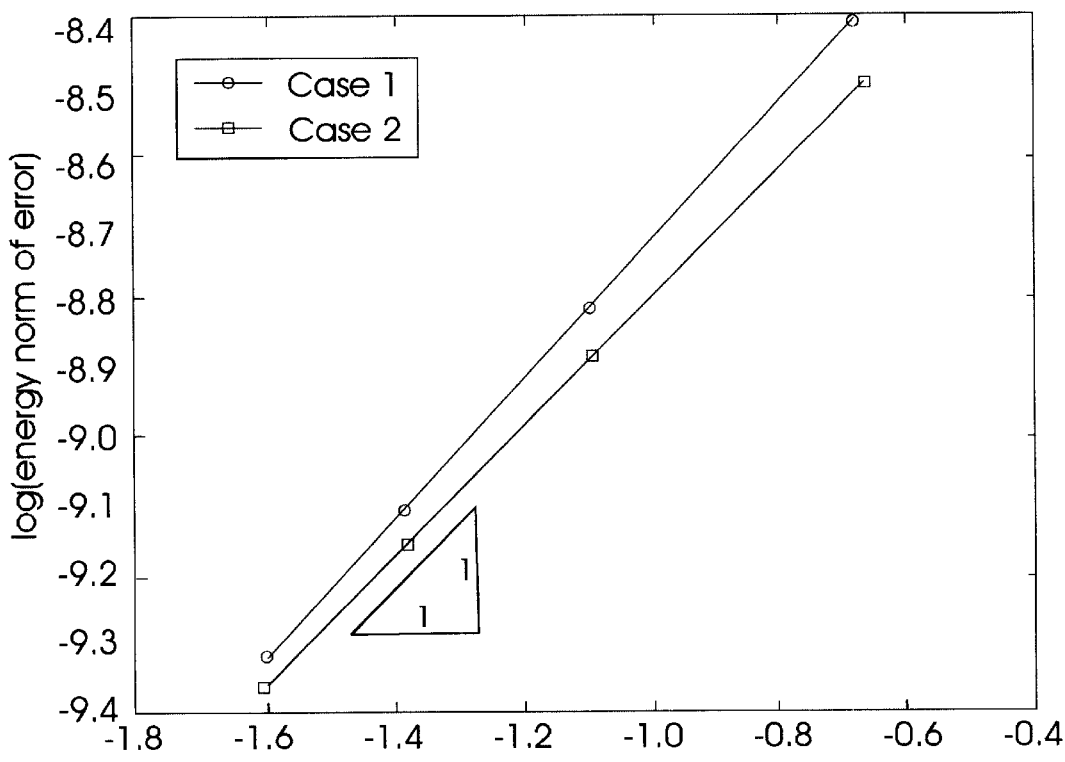
FIG. 10 is a graph of energy norms of the error for an example application.
Figure 11:
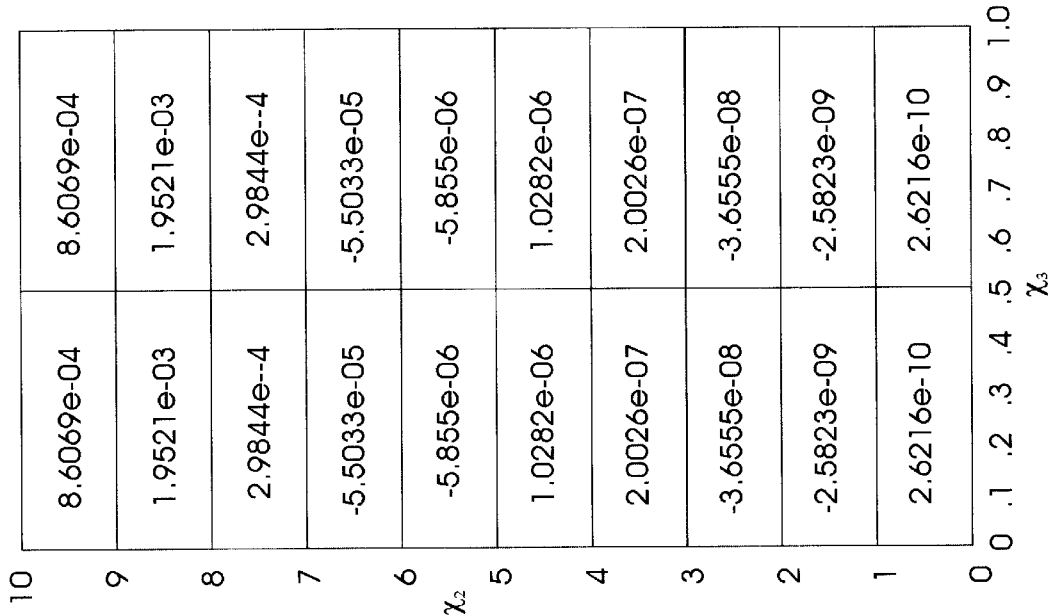
FIG. 11 is a listing of stress components at element centroids for an example application.
Figure 12:
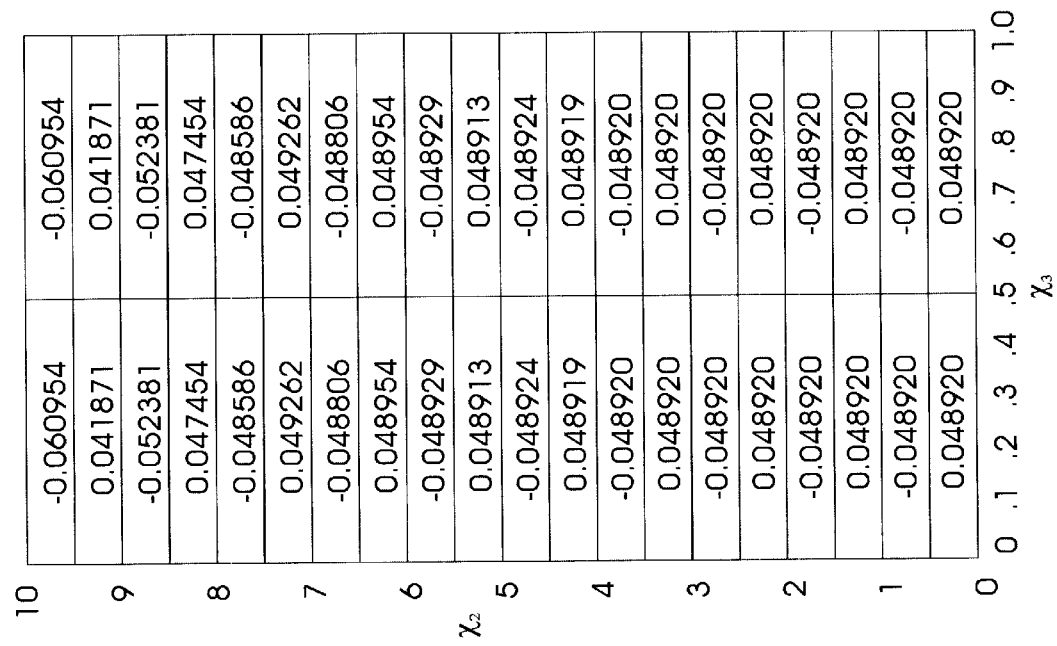
FIG. 12 is a listing of stress components at element centroids for an example application.

Plots of the energy norm of the error for the method are shown in FIG. 10 for Case 1 and Case 2. Notice that Case 2 is consistently more accurate for all the mesh resolutions considered. In order to investigate the cause of these differences, the shear stress component $\sigma_{12}$ was calculated at the centroids of elements with faces on the slave surface. Results of these calculations are presented in FIGS. 11 and 12 for n=2. The exact value of $\sigma_{12}$ for this example is zero over the entire domain of both meshes. Notice that the magnitudes of $\sigma_{12}$ are significantly smaller for Case 2 than Case 1. It is possible that results for Case 2 are more accurate than those for Case 1 because fewer degrees of freedom are constrained at the shared boundary. This example shows that there may be a preferred choice for the master surface in certain instances.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A method of performing in a computer a finite element simulation of a problem space comprising first and second adjacent volumes, wherein a master mesh having an interface surface proximal to said second subspace represents said first subspace, and a dissimilar slave mesh having an interface surface proximal to said first subspace represents said second subspace, said method comprising:

a) determining new coordinates for each slave interface node, wherein said new coordinates are located on the interface surface of said master mesh;

b) redefining the slave interface surface for each slave interface mesh element to conform to the master interface surface by determining the projection of an adjoining face of said slave element onto the master interface mesh, whereby the first and second subspaces become connected;

c) determining an expression for the new volume of each slave interface mesh element based on the new coordinates of slave interface nodes and the redefined slave interface surface;

d) calculating a new volume derivative matrix, $\hat{B}_{ji}$, for each slave interface mesh element using the expression determined in step c) for the new volume of the element;

e) calculating a new element stiffness matrix for each slave interface mesh element that uses the new volume derivative matrix, $\hat{B}_{ji}$, determined in step d); and f) using the new element stiffness matrix determined in step e) for each slave interface mesh element when performing a finite element analysis of the connected first and second subspaces.

2. The method of claim 1, wherein determining the new coordinates of each slave interface element in step a) comprises using a minimum distance criterion.

3. The method of claim 1, wherein the slave interface elements comprise uniform strain elements.

4. The method of claim 1, wherein the slave interface elements comprise linear strain elements.

5. The method of claim 4, wherein the stiffness matrix, K, of a slave interface element is expressed as the sum of a basic stiffness matrix, $K_u$, and a higher-order stiffness matrix, $K_r$; and further wherein the new volume derivative matrix, $\hat{B}_{ji}$, determined in step d) is used in step e) to modify only the basic stiffness matrix and not the higher-order stiffness matrix.

* * * * *